(12) United States Patent
Dzahini

(10) Patent No.: US 7,737,753 B2
(45) Date of Patent: Jun. 15, 2010

(54) METHOD AND DEVICE FOR ADJUSTING OR SETTING AN ELECTRONIC DEVICE

(75) Inventor: Daniel Kwami Dzahini, Echirolles (FR)

(73) Assignees: Universite Joseph Fourier, Saint Martin D'Heres (FR); Centre National de la Recherche Scientifique-CNRS, Paris (FR)

( * ) Notice: Subject to any disclaimer, the term of this patent is extended or adjusted under 35 U.S.C. 154(b) by 0 days.

(21) Appl. No.: 12/087,062

(22) PCT Filed: Dec. 22, 2006

(86) PCT No.: PCT/FR2006/002847

§ 371 (c)(1),
(2), (4) Date: Jan. 5, 2009

(87) PCT Pub. No.: WO2007/074231

PCT Pub. Date: Jul. 5, 2007

(65) Prior Publication Data

US 2009/0128194 A1    May 21, 2009

(30) Foreign Application Priority Data

Dec. 27, 2005    (FR) .................................. 05 13366

(51) Int. Cl.
H03F 1/02    (2006.01)
(52) U.S. Cl. ............................ 327/307; 327/87; 327/89; 330/9; 330/259; 330/278; 330/290
(58) Field of Classification Search .................. 327/77, 327/87–89, 306, 307; 330/9, 97, 259, 270, 330/278, 290
See application file for complete search history.

(56) References Cited

U.S. PATENT DOCUMENTS

| 4,495,470 | A  | * | 1/1985  | Bristol .......................... 330/9 |
| 4,628,274 | A  | * | 12/1986 | Vittoz et al. .................... 330/9 |
| 6,498,530 | B1 |   | 12/2002 | Tang |
| 6,515,464 | B1 | * | 2/2003  | Darmawaskita et al. .. 324/76.11 |
| 7,459,966 | B2 | * | 12/2008 | Nakao ............................ 330/9 |

FOREIGN PATENT DOCUMENTS

| EP | 118 178 | 9/1984 |
| EP | 161 215 | 11/1985 |
| WO | WO 02/27942 A2 | 4/2002 |

* cited by examiner

Primary Examiner—Lincoln Donovan
Assistant Examiner—Patrick O'Neill
(74) Attorney, Agent, or Firm—Clark & Brody

(57) ABSTRACT

Method and device for adjusting or setting an electronic device (1) exhibiting at least one input for an external input signal and at least one output signal output, the value or the state of the output signal being a function of the values or of the state of the input signal. A memory circuit (9) for the value of an adjustment signal is linked to an adjustment input of the electronic device. A circuit (11) increments/decrements said adjustment value stored in said memory circuit. A switching circuit (12) switches said input of the electronic device to a predetermined state and links said output of the electronic device to said memory circuit via said incrementing/decrementing circuit. Said incrementing/decrementing circuit (11) is adapted for adjusting the value of said adjustment signal so that, when said input is switched to said predetermined state, the value or the state of said output signal tend to or attain a predetermined value or a predetermined state.

11 Claims, 1 Drawing Sheet

METHOD AND DEVICE FOR ADJUSTING OR SETTING AN ELECTRONIC DEVICE

Figure 1:
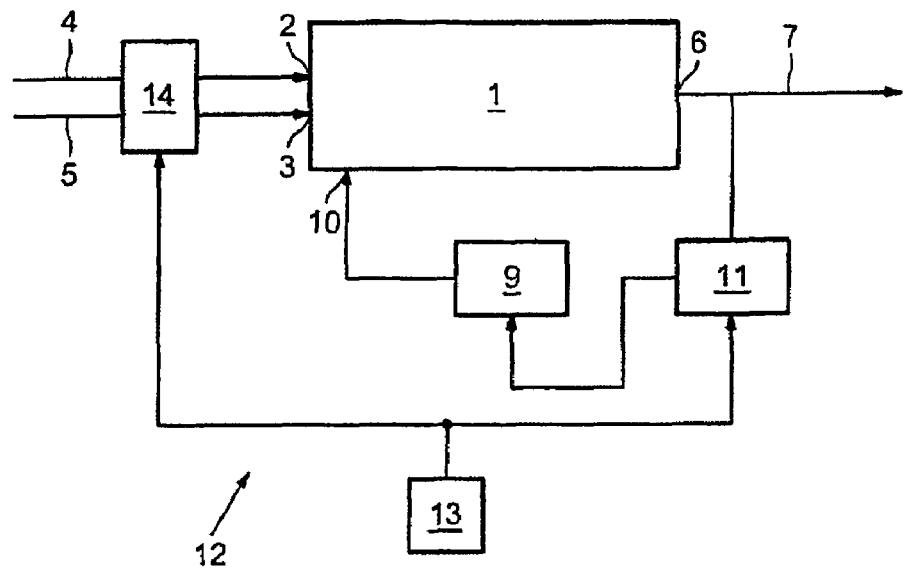

The present invention relates to a method and a device for adjusting or setting an electronic device.

The offset, that is to say the difference, the gap or the shift between the value or the state of the signals at the outputs of electronic devices with respect to the value or the state that they ought ideally to have, constitutes a significant concern. This concern relates in particular to analog electronic devices, such as voltage or current comparators, as well as voltage or current amplifiers.

To reduce the offset of comparators, it is known to cascade several successive amplifier stages, exhibiting increasingly large gains. These stages are linked via capacitors and the offset compensation signal is obtained by temporarily short-circuiting the corresponding inputs/outputs of each stage. Unfortunately, this layout requires several short-circuiting operations which increase the output lag of the comparison results.

Another layout of comparators with relatively low offset consists in using a wideband preamplification stage with small offset, followed by a flip-flop stage.

Another layout of comparators reducing the dispersion in offset consists in using several preamplification stages subjected to a resistive averaging bridge linking together the outputs of these stages.

In all the above layouts, the offsets of the flip-flop stages remain what they are in the comparison chains and the problems of current consumption persist.

In accordance with the foregoing, documents U.S. Pat. No. 6,498,530, WO-A-02/27942, EP-A-0 161 215 and EP-A-0 118 178 propose solutions which employ voltages to vary and set the voltage across the terminals of adjustment capacitors.

The aim of the present invention is to reduce the offset and to reduce the current consumption of electronic devices.

The subject of the present invention is primarily a device for adjusting or setting an electronic device exhibiting at least one input for at least one external input signal and at least one output signal output, the value or the state of the output signal being a function of the value or of the state of said at least one input signal, comprising a memory circuit for the value of an adjustment signal, linked to an adjustment input of the electronic device; a circuit for incrementing/decrementing said adjustment value stored in said memory circuit; and a switching circuit for momentarily switching said at least one input of the electronic device to a predetermined state and for linking said output of the electronic device to said memory circuit via said incrementing/decrementing circuit; said incrementing/decrementing circuit being adapted for adjusting the value of said adjustment signal in such a way that, when said at least one input of the electronic device is switched to said predetermined state, the value or the state of said output signal tends to or attains a predetermined value or a predetermined state.

According to the invention, said incrementing/decrementing circuit comprises a charge pump whose opposite elements are linked to said signal output of the electronic device and to an output complementary thereto and whose common point is linked to said adjustment input of the electronic device and that said memory circuit comprises a capacitor linked on the one hand to a ground and on the other hand to said common point of said charge pump.

According to the invention, the electronic device preferably exhibits at least two inputs for external input signals and that said switching circuit is adapted for switching said inputs of the electronic device to a predetermined state, one with respect to the other.

According to a variant of the invention, the electronic device can advantageously be a comparator.

According to the invention, said comparator can advantageously comprise a preamplifier followed by a flip-flop, said adjustment signal being delivered to an adjustment input of the preamplifier.

The subject of the present invention is also a method for adjusting or setting an electronic device exhibiting at least one input for at least one external input signal and at least one output signal output, the value of the output signal being a function of the value or of the state of said at least one input signal.

According to the invention, this method consists, during at least one adjustment phase:

in switching said at least one input of the electronic device into a predetermined state;

in adjusting the value of an adjustment signal for the electronic device by way of a charge pump in such a way that the value or the state of said output signal tend to or attain a predetermined value or a predetermined state;

and in storing the adjusted value of said adjustment signal, represented by the charge of a capacitor.

The method according to the invention furthermore consists, after said adjustment phase, in subjecting the electronic device to said adjusted value of said adjustment signal.

According to the invention, the method can advantageously consist in switching at least two inputs for external input signals of the electronic device into a predetermined state, one with respect to the other.

According to the invention, the method can advantageously consist in short-circuiting said inputs of the electronic device and in adjusting the value of said adjustment signal in such a way that the value or the state of said output signal tends to or attains a predetermined threshold.

According to the invention, the method can advantageously consist consists in short-circuiting said inputs of the electronic device and in adjusting the value of said adjustment signal in such a way that the value or the state of said output signal tends to or attains a switching threshold.

According to the invention, the charge of said capacitor is preferably adjusted by a charge pump whose opposite elements are linked to said signal output of the electronic device and to an output complementary thereto.

In a general way, according to the present invention, the incrementation/decrementation of the voltage of the envisaged adjustment capacitor is effected by a current, this current arising from the common point of a charge pump subjected to the output signal of the electronic device that is to be adjusted or set.

Figure 2:
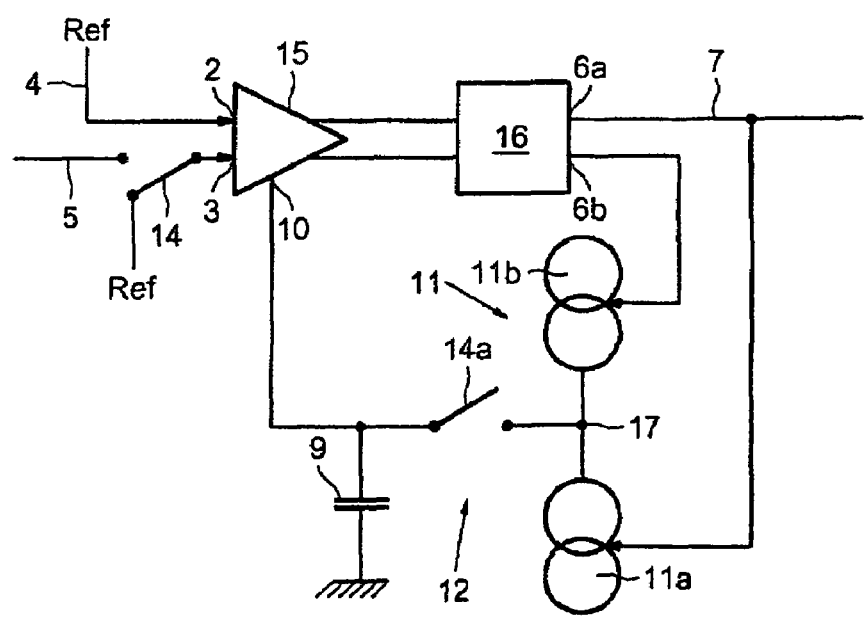

The present invention will be better understood on studying a device for adjusting or setting an electronic device and its mode of operation, described by way of nonlimiting examples and illustrated by the appended drawing in which:

FIG. 1 represents a general electronic diagram of the present invention;

And FIG. 2 represents an electronic diagram of a particular application of the present invention.

Referring to FIG. 1, represented therein is an electronic device 1 which comprises two inputs 2 and 3 for external signals, linked to external lines 4 and 5 and an output signal output 6 linked to a signal output external line 7. The value or the state of the output signal is a function of the values or of the states of the input signals.

With this device 1 is associated an adjustment or setting device 8 which comprises a memory circuit 9 for the value of an adjustment signal, which is linked to an adjustment or setting input 10 of the electronic device 1, an incrementing/decrementing circuit 11, which is linked on the one hand to the output 6 of the electronic device 1 and to the memory circuit 9, and a switching circuit 12, which comprises a clock circuit 13 linked to a switch 14 mounted on the lines 4 and 5 and linked to an activation input 15 for the incrementing/decrementing circuit 11.

During an adjustment or setting phase, the clock circuit 13 delivers a signal which momentarily activates the incrementing/decrementing circuit 11 and the switch 14.

The switch 14 then places the inputs 2 and 3 of the electronic device 1 in a predetermined reference state, one with respect to the other and the output 6 of the electronic device 1 is then linked to the memory circuit 9 via the incrementing/decrementing circuit 11.

The incrementing/decrementing circuit 11 is adapted for adjusting, in the memory circuit 9, the value of the adjustment signal. For this purpose, the modified value of the adjustment signal is delivered to the electronic device 1 which applies its intrinsic function between its switched outputs 2 and 3 and its output 6. This output signal is delivered to the incrementing/decrementing circuit 11 which modifies the adjustment signal delivered to the electronic device 1. This loop for determining the adjustment value executes in such a way that the value or the state of the output signal delivered to the output 6 of the electronic device 1 tends to or attains an ideal predetermined value or an ideal predetermined state.

After a predetermined duration fixed by the clock circuit 13, fixing the end of the adjustment or setting phase, the clock circuit 13 re-switches the switch 14 to its initial position and deactivates the incrementing/decrementing circuit 11. The final value of the adjustment signal, at the end of the adjustment phase, is stored in the memory circuit 9 so as to be delivered to the electronic device 1.

Following said adjustment phase, the electronic device 1 applies its intrinsic function, between its inputs 2 and 3 linked to the external lines 4 and 5 and its output 6 linked to the output line 7, while being subjected to the value of the adjustment signal stored in the memory circuit 9, which constitutes a reduction factor for the offset of the electronic device 1.

The clock circuit 13 is adapted for reproducing the adjustment phase described above, for example according to predetermined time gaps.

An exemplary application of the arrangements of FIG. 1 to an electronic device 1 constituting a comparator which compares the values of the signals arising from the lines 4 and 5 and delivers to its output a change-of-state signal corresponding to this comparison will now described while referring to FIG. 2.

This comparator 1 comprises a preamplifier 15 exhibiting the inputs 2 and 3, of which for example the input 2 is linked to a reference signal, for example to a ground, by the line 4 and whose input 3 is linked to an input external signal by the line 6.

Following the preamplifier 15, the comparator 1 comprises a flip-flop 16 exhibiting an output 6a and an output 6b one of these outputs corresponding to the output 6 for delivering an output signal on the line 7. With respect to a switching threshold corresponding to the comparison of the signals arising from the input lines 4 and 5, the output 6a delivers a signal Q and the output 6b delivers an inverse signal Q Bar.

The adjustment or setting device 8 comprises a capacitor 9 by way of memory circuit and a charge pump 11 by way of incrementing/decrementing circuit, as well as a switch 14 adapted for switching the input 3 either towards the line 5 or towards a reference signal, in particular a ground, and a breaker 14a by way of switching circuit. The clock circuit 13 is linked to the switch 14 and to the breaker 14a.

In greater detail, one of the terminals of the capacitor 9 is linked to a ground and its other terminal is linked on the one hand to the common point 17 of the charge pump 11 via the breaker 14a and on the other hand to an adjustment or setting input 10 of the preamplifier 15. The outputs 6a and 6b of the flip-flop 16 are respectively linked to the two opposite elements 11a and 11b of the charge pump 11. According to a variant, the output 6a of the electronic device 16 could be linked to the element 11b of the charge pump 11 through an inverter circuit.

During an adjustment or setting phase, the clock circuit 13 delivers a signal which momentarily activates the switch 14 so as to short-circuit the line 5 and link the input 3 of the preamplifier 15 to the corresponding reference and which momentarily activates the breaker 14a to its closed state so as to link the common point 17 of the charge pump 11 to the capacitor 9 and therefore to the adjustment input 10 of the preamplifier 15.

As soon as the adjustment or setting phase is launched, the charge pump 11 delivers to the capacitor 9, through its common point 17, a charge or discharge signal for this capacitor as a function of the state of the outputs 6a and 6b of the flip-flop 16, this state depending on the value of the adjustment signal delivered to the preamplifier 15 which alters the latter's preamplification values. Thus, successively, the charge of the capacitor 9 tends to a final value such that the state of the outputs 6a and 6b of the flip-flop 16 tends to a common switching threshold through successive inversions resulting from successive incrementations and decrementations of the value of the adjustment signal.

After a predetermined duration fixed by the clock circuit 13, fixing the end of the adjustment or setting phase, the clock circuit 13 re-switches the switch 14 and the breaker 14a to their initial states, the input 3 of the preamplifier 15 being again linked to the external line 5 and the breaker 14a reverting to the open state.

The duration of the adjustment or setting phase is fixed in such a way that the adjustment of the charge of the capacitor 9, and therefore the adjustment of the switching threshold of the flip-flop 16 corresponding to the switched state of the inputs 2 and 3 of the preamplifier 15, can execute according to a desired approximation.

Following said adjustment phase, the final value attained of the charge of the capacitor 9 persists and is applied permanently to the adjustment input 10 of the preamplifier 15.

The comparison chain for the comparator 1, consisting of the preamplifier 15 and the flip-flop 16, then operates under the effect of the final value attained of the charge of the capacitor 9, in such a way that the offset of this chain is reduced.

Additionally, the presence of the adjustment device 12 hardly handicaps the intrinsic current consumption of the comparator 1.

The present invention is not limited to the above-described examples. Variants of embodiment and application are possible without departing from the scope defined by the appended claims.

The invention claimed is:

1. A device for adjusting or setting an electronic device (1) exhibiting at least one input for at least one external input signal and at least one output signal output, the value or the state of the output signal being a function of the value or of the state of said at least one input signal, comprising a memory circuit (9) for the value of an adjustment signal, linked to an adjustment input (10) of the electronic device; a circuit (11) for incrementing/decrementing said adjustment value stored in said memory circuit; and a switching circuit (12) for momentarily switching said at least one input (2, 3) of the electronic device (1) to a predetermined state and for linking said output (6) of the electronic device (1) to said memory circuit (9) via said incrementing/decrementing circuit (11); said incrementing/decrementing circuit (11) being adapted for adjusting the value of said adjustment signal in such a way that, when said at least one input (2, 3) of the electronic device (1) is switched to said predetermined state, the value or the state of said output signal tends to or attains a predetermined value or a predetermined state, characterized in that said incrementing/decrementing circuit comprises a charge pump (11) whose opposite elements (11a, 11b) are linked to said signal output (6a) of the electronic device and to an output (6b) complementary thereto and whose common point (17) is linked to said adjustment input (10) of the electronic device and that said memory circuit comprises a capacitor (9) linked on the one hand to a ground and on the other hand to said common point (17) of said charge pump (11).

2. The device as claimed in claim 1, characterized in that the electronic device (1) exhibits at least two inputs for external input signals and that said switching circuit (12) is adapted for switching said inputs (2, 3) of the electronic device (1) to a predetermined state, one with respect to the other.

3. The device as claimed in claim 2, characterized in that the electronic device (1) is a comparator.

4. The device as claimed in claim 1, characterized in that the electronic device (1) is a comparator.

5. The device as claimed in claim 4, characterized in that said comparator comprises a preamplifier (15) followed by a flip-flop (16), said adjustment signal being delivered to an adjustment input (10) of the preamplifier (15).

6. A method for adjusting or setting an electronic device exhibiting at least one input for at least one external input signal and at least one output signal output, the value of the output signal being a function of the value or of the state of said at least one input signal, characterized in that it consists, during at least one adjustment phase:
    in switching said at least one input (2, 3) of the electronic device (1) into a predetermined state;
    in adjusting the value of an adjustment signal for the electronic device by way of a charge pump (11) in such a way that the value or the state of said output signal tend to or attain a predetermined value or a predetermined state;
    and in storing the adjusted value of said adjustment signal, represented by the charge of a capacitor;
    and in that it consists, after said adjustment phase, in subjecting the electronic device to said adjusted value of said adjustment signal.

7. The method as claimed in claim 6, the electronic device exhibiting at least two inputs for external input signals, characterized in that it consists in switching said inputs (2, 3) of the electronic device (1) into a predetermined state, one with respect to the other.

8. The method as claimed in claim 7, characterized in that it consists in short-circuiting said inputs of the electronic device and in adjusting the value of said adjustment signal in such a way that the value or the state of said output signal tends to or attains a predetermined threshold.

9. The method as claimed in claim 8, characterized in that the charge of said capacitor is adjusted by the charge pump whose opposite elements are linked to said signal output (6a) of the electronic device and to a complementary output (6b) of the latter.

10. The method as claimed in claim 8, characterized in that it consists in short-circuiting said inputs of the electronic device and in adjusting the value of said adjustment signal in such a way that the value or the state of said output signal tends to or attains a switching threshold.

11. The method as claimed in claim 7, characterized in that it consists in short-circuiting said inputs of the electronic device and in adjusting the value of said adjustment signal in such a way that the value or the state of said output signal tends to or attains a switching threshold.

* * * * *